United States Patent
Harper et al.

(10) Patent No.: US 12,131,899 B2
(45) Date of Patent: *Oct. 29, 2024

(54) METHOD OF DEPOSITION

(71) Applicant: SPTS Technologies Limited, Newport (GB)

(72) Inventors: Tristan Harper, Newport (GB); Kathrine Crook, Newport (GB)

(73) Assignee: SPTS Technology Limited, Newport (GB)

( * ) Notice: Subject to any disclaimer, the term of this patent is extended or adjusted under 35 U.S.C. 154(b) by 223 days.

This patent is subject to a terminal disclaimer.

(21) Appl. No.: 17/326,273

(22) Filed: May 20, 2021

(65) Prior Publication Data

US 2021/0391170 A1 Dec. 16, 2021

(30) Foreign Application Priority Data

Jun. 11, 2020 (GB) .................................. 2008892

(51) Int. Cl.
*H01L 21/02* (2006.01)
*H01L 23/00* (2006.01)

(52) U.S. Cl.
CPC .. *H01L 21/02167* (2013.01); *H01L 21/02211* (2013.01); *H01L 21/02274* (2013.01); *H01L 24/83* (2013.01); *H01L 2224/83896* (2013.01)

(58) Field of Classification Search
None
See application file for complete search history.

(56) References Cited

U.S. PATENT DOCUMENTS

| | | | |
|---|---|---|---|
| 6,140,255 A | 10/2000 | Ngo et al. | |
| 9,831,346 B1 * | 11/2017 | Zang | H01L 21/28518 |
| 2002/0027286 A1 | 3/2002 | Sundararajan et al. | |
| 2010/0129994 A1 * | 5/2010 | Awad | C23C 16/325 |
| | | | 427/255.6 |
| 2010/0291321 A1 * | 11/2010 | Mallikarjunan | H01L 21/3148 |
| | | | 427/579 |
| 2020/0247830 A1 * | 8/2020 | Lei | C23C 16/45536 |

FOREIGN PATENT DOCUMENTS

| | | |
|---|---|---|
| CN | 108056831 A | 5/2018 |
| KR | 20110060796 A | 6/2011 |

OTHER PUBLICATIONS

Khatami et al., "Influence of Deposition Conditions on the Characteristics of Luminescent Silicon Carbonitride Thin Films", ECS Journal of Solid State Science and Technology, Jan. 19, 2018, pp. N7-N14, vol. 7, Issue 2, IOP Publishing.

(Continued)

*Primary Examiner* — Asok K Sarkar
(74) *Attorney, Agent, or Firm* — Hodgson Russ LLP

(57) ABSTRACT

A hydrogenated silicon carbon nitride (SiCN:H) film is deposited onto a substrate by plasma enhanced chemical vapour deposition (PECVD) comprising: providing the substrate in a chamber; introducing silane (SiH$_4$), a carbon-donating precursor, and nitrogen gas (N$_2$) into the chamber; and sustaining a plasma in the chamber so as to deposit SiCN:H onto the substrate by PECVD, wherein the substrate is maintained at a temperature of less than about 250° C.

19 Claims, 5 Drawing Sheets

(56) References Cited

OTHER PUBLICATIONS

UK IPO, Search Report for Application No. GB2008892.8, Nov. 13, 2020.
Rahman et al., "Multi-phase structured hydrogenated amorphous silicon carbon nitride thin films grown by plasma enhanced chemical vapour deposition," Journal of Alloys and Compounds, 2017, vol. 721, pp. 70-79.
Rahman et al., "Aging- and thermal-annealing effects on the vibrational- and microstructural-properties of PECVD grown hydrogenated amorphous silicon carbon nitride thin films," Vibrational Spectroscopy, 2018, vol. 94, pp. 22-30.
EPO, Partial European Search Report for EP Application No. 21172117, Oct. 13, 2021.

* cited by examiner

METHOD OF DEPOSITION

CROSS-REFERENCE TO RELATED APPLICATIONS

This application claims priority to UK Patent Application 2008892.8 filed Jun. 11, 2020, the disclosure of which is hereby incorporated by reference.

FIELD OF THE DISCLOSURE

This invention relates to a method of depositing a silicon carbon nitride film by plasma enhanced chemical vapour deposition (PECVD). In particular, this invention relates to a method of depositing a hydrogenated silicon carbon nitride (SiCN:H) film by PECVD. This invention also relates to a substrate with an associated SiCN:H film. This invention also relates to methods of bonding two substrates, and an associated device comprising two bonded substrates.

BACKGROUND OF THE DISCLOSURE

Two-dimensional (2D) scaling of electronic devices based on Moore's law is set to continue for the foreseeable future. However, three-dimensional (3D) integration of devices, either homogeneous or heterogeneous, offers great potential for advanced system development. It is believed that "stacking" devices in 3D could achieve greater integration, which in turn will provide improved device performance, improved functionality and, in time, reduced cost compared to a 2D scaling approach.

To achieve efficient 3D integration of devices, it is desirable to bond two substrates, such as device wafers, together so that a large number of die can be stacked simultaneously. Surface activated bonding techniques are promising candidates for achieving suitable 3D stacking of devices. Typically, a surface activated bonding process includes treating a surface of two substrates for example with a dielectric bonding/adhesion layer, such as a silicon carbon nitride (SiCN) layer (including a hydrogenated silicon carbon nitride (SiCN:H) layer). The two treated surfaces may then be smoothed by chemical mechanical planarization (CMP), precisely aligned, pressed together at an elevated temperature, and annealed so as to bond the substrates together.

Known surface activated bonding techniques use dielectric bonding layers and adhesion layers, such as SiCN and SiCN:H, which are deposited at a high temperature (about 340-370° C.) and may further require densification steps at about 420° C. prior to bonding. Due to the high temperatures required, these known processes are not suitable for bonding substrates which have a low thermal budget constraint (i.e. temperature sensitive substrates). For example, it is critical that substrates comprising device layers and/or interconnects, which may include copper layers embedded in a dielectric, maintain a low thermal budget to avoid damaging the devices.

However, simply lowering the deposition temperature of the bonding and adhesion layers results in adhesion layers having poor bond strength, poor copper barrier layer properties, and high sensitivity to moisture. Therefore, simply lowering the temperature of known deposition processes provides unacceptable results.

There is therefore a need for a method in which dielectric barrier and adhesion layers for wafer-wafer bonding can be deposited at significantly lower temperatures, whilst maintaining excellent device performance. This is desirable so that a wider variety of substrates (in particular substrates having low thermal budget constraints) can be bonded using surface activated bonding techniques. By providing such a method, improved 3D integration of devices can be achieved, which is expected to improve device performance.

BRIEF SUMMARY OF THE DISCLOSURE

The present invention, in at least some of its embodiments, seeks to address at least some of the above described problems, desires and needs. In particular, embodiments of the present invention seek to provide a method of depositing a hydrogenated silicon carbon nitride (SiCN:H) film capable of maintaining a low thermal budget to the substrate. SiCN:H films deposited by methods of the present invention are suitable for use as adhesion layers in surface activated bonding techniques, whilst keeping within low thermal budget constraints. The films also exhibit good copper barrier layer properties, and are stable in the presence of moisture.

According to a first aspect of the invention there is provided a method of depositing a hydrogenated silicon carbon nitride (SiCN:H) film onto a substrate by plasma enhanced chemical vapour deposition (PECVD) comprising:

providing the substrate in a chamber;
introducing silane ($SiH_4$), a carbon-donating precursor, and nitrogen gas ($N_2$) into the chamber; and
sustaining a plasma in the chamber so as to deposit SiCN:H onto the substrate by PECVD, wherein the substrate is maintained at a temperature of less than about 250° C.

Using a deposition recipe comprising the combination of silane ($SiH_4$), a separate carbon-donating precursor, and nitrogen gas ($N_2$) as reactive precursors has been found to produce a stable SiCN:H film with good barrier layer and adhesion layer properties, whilst maintaining within low thermal budget constraints. The SiCN:H film is suitable for use as an adhesion layer in surface activated bonding processes. Therefore, the method is suitable for 3D integration of a wide variety of substrates, including device wafers, which contain temperature sensitive device layers and their interconnects that may be embedded in the substrate. The reactive precursors used can consist essentially of the combination of silane ($SiH_4$), a separate carbon-donating precursor, and nitrogen gas ($N_2$). Preferably, the reactive precursors used consist of the combination of silane ($SiH_4$), a separate carbon-donating precursor, and nitrogen gas ($N_2$). Optionally, one or more non-reactive carrier gases may also be introduced into the chamber.

The carbon-donating precursor can be an organosilane, a gaseous hydrocarbon, or combinations thereof. Preferably, the carbon-donating precursor is an organosilane. The organosilane can be an alkylsilane. The organosilane can be selected from: methylsilane, dimethylsilane, trimethylsilane, tetramethylsilane, or combinations thereof. Preferably, the organosilane is trimethylsilane or tetramethylsilane. Most preferably, the organosilane is trimethylsilane. Using a deposition recipe comprising the combination of silane ($SiH_4$), an organosilane, and nitrogen gas ($N_2$) has been found to produce SiCN:H films with particularly desirable characteristics, for example, as a good copper barrier layer. Optionally, the carbon-donating precursor can be a gaseous hydrocarbon. The gaseous hydrocarbon can be methane ($CH_4$) or acetylene ($C_2H_2$).

Silane ($SiH_4$) is a silicon-donating precursor. Silane ($SiH_4$) can be introduced into the chamber at a flow rate in the range of 100-500 sccm, optionally, 200-400 sccm, optionally 250-300 sccm, or optionally about 275 sccm.

The carbon-donating precursor can be introduced into the chamber at a flow rate in the range of 10-90 sccm, optionally 20-70 sccm, or optionally 25-55 sccm.

The carbon-donating precursor can be introduced into the chamber at a flow rate that is less than the flow rate of silane ($SiH_4$). The carbon-donating precursor can have a flow rate that is about 2-50%, optionally about 5-25%, optionally about 7-20%, optionally about 8-15%, or optionally about 10-11%, of the flow rate of silane ($SiH_4$).

Silane ($SiH_4$) and the carbon-donating precursor, such as trimethylsilane, can be introduced into the chamber at flow rates (in sccm) in ratio in the range of 3:1 to 30:1, optionally 4:1 to 25:1, optionally 5:1 to 20:1, optionally about 7:1 to 15:1, optionally about 10:1 to 12:1, or optionally about 11:1. Introducing silane ($SiH_4$) and the carbon-donating precursor into the chamber at these ratios can improve the adhesion characteristics of the deposited SiCN:H film, whilst maintaining a high resistance to moisture uptake. Without wishing to be bound by any theory or conjecture, it is believed that the improved adhesion characteristics are a consequence of increased carbon content in the deposited SiCN:H film. By way of example only, where the carbon-donating precursor is trimethylsilane, it is preferable that the ratio of silane ($SiH_4$) to trimethylsilane is about 10:1 to 12:1, or most preferably 11:1.

Nitrogen gas ($N_2$) is a nitrogen-donating precursor. Nitrogen gas ($N_2$) can be introduced into the chamber at a flow rate in the range of 1000-10,000 sccm, optionally 2,500-9,000 sccm, optionally 4,000-8,000 sccm, or optionally 6,000-7,000 sccm. Optionally, ammonia ($NH_3$) is absent as a nitrogen-donating precursor. Advantageously, $N_2$ is the only nitrogen-donating precursor used.

During the PECVD step, the substrate can be maintained at a temperature of less than 225° C. optionally less than 200° C., or optionally about 175° C. or less. The substrate may be maintained at a temperature of more than 100° C., optionally more than 125° C., optionally more than 150° C. Maintaining the substrate at these temperatures can keep the substrate within low thermal budget constraints, which makes the present method suitable for depositing SiCN:H films onto temperature sensitive substrates. For example, the method can be used to deposit SiCN:H (adhesion) layers onto temperature sensitive substrates comprising device layers and/or interconnects, which may include copper layers embedded in a dielectric.

Whilst the plasma is being sustained in the chamber, the chamber can have a pressure in the range of 1,000-5,000 mTorr, optionally 1,400-3,000 mTorr, optionally about 1,600 mTorr.

The plasma can be sustained using a high frequency RF power. Alternatively, the plasma can be sustained using a high frequency RF power and a low frequency RF power.

The high frequency RF power can have a frequency in the range of 10-15 MHz, preferably 13.56 MHz. The high frequency RF power can have a power in the range of 250-1,250 W, optionally 500-1,000 W, optionally 700-900 W, or optionally about 800 W.

The low frequency RF power can have a frequency in the range of 100-500 kHz, optionally about 200-450 kHz, optionally, about 300-400 kHz, or optionally about 380 kHz. The low frequency RF power can have a power in the range of 0-400 W, optionally 50-300 W, or optionally 100-200 W.

The method can further comprise the subsequent step of performing a hydrogen plasma treatment comprising exposing the SiCN:H film to a hydrogen plasma. The hydrogen plasma treatment can further enhance the stability of the SiCN:H film. Without wishing to be bound by any theory or conjecture, it is believed that the hydrogen plasma treatment acts to passivate the surface of the SiCN:H film, thereby preventing surface absorption of moisture and formation of SiO. The hydrogen plasma treatment can be performed without a break in vacuum. The hydrogen plasma treatment can be performed without exposing the SiCN:H film to water vapour.

During the hydrogen plasma treatment, the substrate can be maintained at a temperature of less than about 200° C., optionally less than about 175° C., optionally less than about 150° C., or optionally about 125° C.

The hydrogenated silicon carbon nitride (SiCN:H) film can be an amorphous film (e.g. a-SiCN:H).

The substrate can be a semiconductor substrate.

According to a second aspect of the invention there is provided a substrate with a SiCN:H film deposited thereon using the method according to the first aspect.

The substrate can be a semiconductor substrate. The substrate can be a silicon substrate or silicon wafer. The substrate can comprise a plurality of die. The substrate can comprise features, such as one or more device layers and/or interconnects. The features may be temperature sensitive. The features can comprise copper layers, for example, copper layers embedded in a dielectric material.

The SiCN:H film may have a refractive index in the range of about 2.0. The SiCN:H film may have a refractive index of about 1.85-2.2, optionally 1.95-2.10, optionally 1.97-2.03, or optionally 1.99-2.00.

The SiCN:H film may have a SiC:SiN ratio (based on FTIR peak area) of less than about 0.01, optionally less than about 0.005, optionally about 0.004.

The SiCN:H film may have a $SiCH_x$:SiN ratio (based on FTIR peak area) of less than about 0.01, optionally about 0.008.

The SiCN:H film may have a NH:SiN ratio (based on FTIR peak area) of less than about 0.02, optionally about 0.018.

The SiCN:H films deposited using methods of the present invention typically exhibit a lower SiC:SiN ratio, a lower $SiCH_x$:SiN ratio, and a lower NH:SiN ratio (based on FTIR peak area) compared to known deposition recipes that are performed at low temperatures (e.g. less than about 250° C.). This is indicative of a high density SiCN (or SiCN:H) film.

The SiCN:H film may have a SiH:SiN ratio (based on FTIR peak area) of more than about 0.8, optionally more than about 0.10, and optionally about 0.12. SiCN:H films deposited using methods according got the present invention typically exhibit a characteristically high SiH:SiN ratio (based on FTIR peak area). The SiCN:H film can have a hydrogen content of more than about 2 at %, optionally more than about 5 at %, or optionally more than about 10 at %.

According to a third aspect of the invention there is provided a method of bonding two substrates comprising the steps of:
providing a first substrate with a SiCN:H film according to the second aspect;
providing a second substrate with a SiCN:H film according to the second aspect; and
bringing the SiCN:H film of the first substrate into contact with the SiCN:H film of the second substrate at a temperature of less than about 250° C. so as to bond the SiCN:H film of the first substrate with the SiCN:H film of the second substrate.

The SiCN:H film of the first substrate can be brought into contact with the SiCN:H film of the second substrate at a temperature in the range of 100-250° C., optionally 125-225° C., optionally 150-200° C., or optionally about 175° C.

The method of bonding the two substrates can further comprise a smoothing step, such as a chemical mechanical planarization (CMP) step, to smooth the SiCN:H film of the first and/or second substrates. The method of bonding two substrates can further comprise the step of aligning the first and second substrate prior to the bringing the SiCN:H films of the first and second substrates into contact.

According to a fourth aspect of the invention there is provided a device comprising a stack of two or more substrates produced using the method of the third aspect.

Whist the invention has been described above, it extends to any inventive combination of the features set out above, or in the following description, drawings or claims. For example, any features disclosed in relation to one aspect of the invention may be combined with any features disclosed in relation to any of the other aspects of the invention.

DESCRIPTION OF THE DRAWINGS

Embodiments of the invention will now be described, by way of example only, with reference to the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Figure 1:
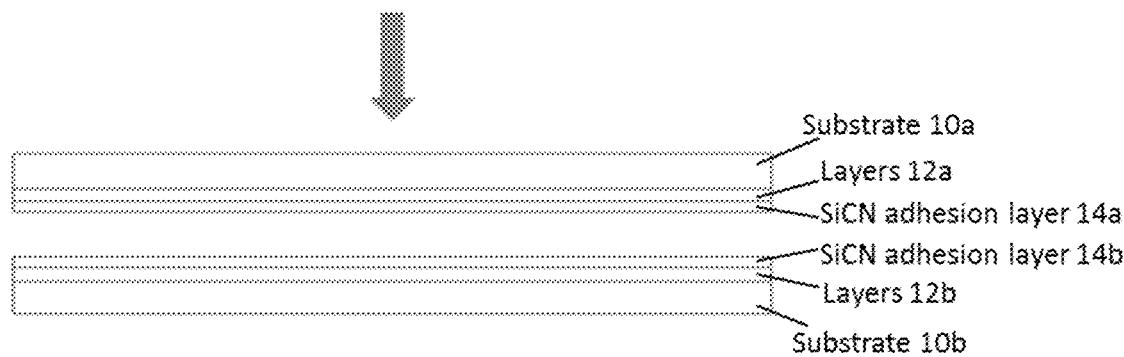
FIG. 1 is a schematic side view of two substrates ready to undergo a surface activated substrate-substrate bonding process.

FIG. 1 shows a schematic of a surface activated bonding process used to bond two substrates together. The substrates 10a, 10b may comprise temperature sensitive features, such as device layers 12a, 12b. An adhesion layer 14a, 14b, such as a silicon carbon nitride (SiCN) layer, such as a hydrogenated silicon carbon nitride (SiCN:H) layer, is deposited on a surface of each substrate 10a, 10b. The two adhesion layers 14a, 14b can be smoothed, for example by chemical mechanical planarization (CMP), precisely aligned, pressed together at an elevated temperature, and annealed so as to bond the two substrates together via the adhesion layers 14a, 14b.

Apparatus suitable for depositing silicon carbon nitride (SiCN) films, such as SiCN:H films, according to exemplary methods of the present invention (and comparative examples) includes an SPTS Delta™ parallel plate PECVD apparatus, which is commercially available from SPTS Technologies Limited, located in Newport, South Wales, UK. All exemplary embodiments and comparative examples described below were performed using this apparatus.

Comparative Examples 1 and 2

SiCN:H adhesion layers are known to be deposited using high temperature (e.g. about 340-370° C.) plasma enhanced chemical vapour deposition (PECVD) using an organosilane and ammonia ($NH_3$) as the reactive precursors. The organosilane acts as both a silicon and a carbon donating precursor, while ammonia serves as a nitrogen donating precursor.

Figure 2:
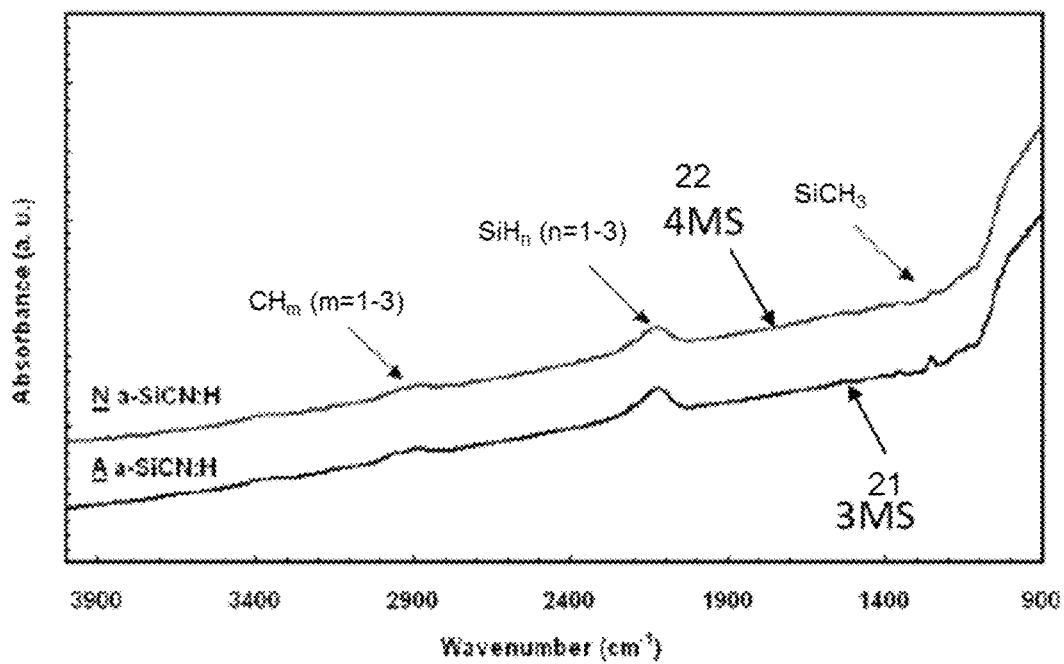
FIG. 2 shows FTIR spectra of SiCN:H films deposited using comparative examples.

As comparative examples (and with reference to FIG. 2), SiCN:H films were deposited onto a 300 mm silicon wafer at 350° C. by PECVD using an organosilane and ammonia ($NH_3$) as the reactive precursors. The chamber pressure was maintained in the range of 1-5 Torr. In comparative example 1 (line 21 of FIG. 2), trimethylsilane (3MS) was used as the organosilane precursor. In comparative example 2 (line 22 of FIG. 2), tetramethylsilane (4MS) was used as the organosilane precursor.

A characteristic Si—$CH_3$ stretching peak is visible at about 1257 $cm^{-1}$ in both comparative examples 1 and 2 but is more pronounced when 3MS is used as the organosilane precursor (i.e. comparative example 1, line 21). Both spectra 21 and 22 show similar strength peaks at about 2133 $cm^{-1}$ and about 2900 $cm^{-1}$ corresponding to Si—$H_n$ (n=1-3) and $CH_m$ (m=1-3) stretching peaks respectively.

Comparative Examples 3 and 4

Figure 3:
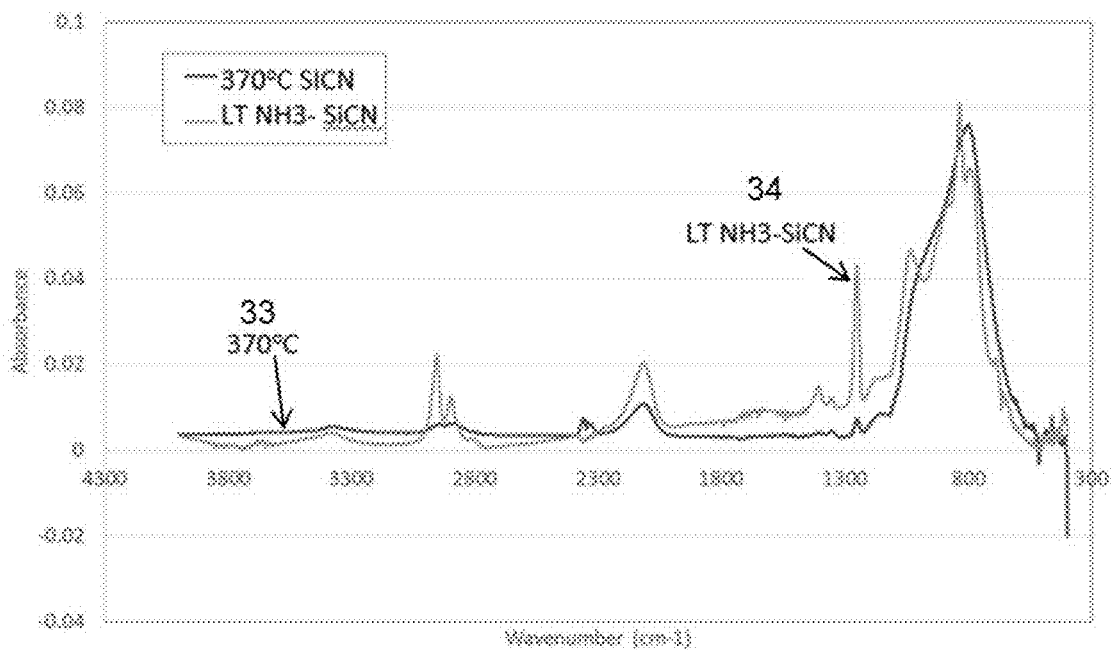
FIG. 3 shows FTIR spectra of SiCN:H films deposited using comparative examples.

As further comparative examples (and with reference to FIG. 3), SiCN:H films were deposited onto a 300 mm silicon wafer by PECVD using trimethylsilane (3MS) and ammonia ($NH_3$) as the reactive precursors. The plasma was sustained using a mixed frequency RF power. That is, a high frequency (HF) RF (operating at 13.56 Hz) and a low frequency (LF) RF (operating at 380 kHz) were used to sustain the plasma. Comparative example 3 (line 33 of FIG. 3) and comparative example 4 (line 34 of FIG. 3) use the same deposition parameters, except that comparative example 3 used a high deposition temperature of 370° C., whereas comparative example 4 used a low deposition temperature of 175° C.

The SiCN:H film deposited in comparative example 3 (line 33) exhibited acceptable properties as an adhesion layer and/or copper barrier layer. However, the high temperature required to deposit this film cannot be used on temperature sensitive substrates (i.e. substrates with a low thermal budget constraint).

The SiCN:H film deposited in comparative example 4 (i.e. at the lower temperature of 175° C., line 34) shows a significant increase in the Si—$CH_3$ stretching peak (~1257 $cm^{-1}$), the Si—$H_n$ (n=1-3) stretching peak (~2133 $cm^{-1}$), and the $CH_m$ (m=1-3) stretching peak (~2900 cm$^{-1}$) compared to the film deposited at 370° C. (comparative example 3, line 30). Additionally, the peaks at 600-1200 cm$^{-1}$ are more prominent for the SiCN:H film deposited at 175° C. These FTIR spectra indicate that the SiCN:H film deposited at 175° C. comprises more $CH_n$, Si—$CH_n$, Si—$H_n$ (n=1-3) terminated groups compared to the SiCN:H film deposited at 370° C.

The SiCN:H films deposited in comparative example 4 (i.e. at 175° C., using 3MS and $NH_3$ as reactive precursors) have a lower density and a lower refractive index of ~1.57. Due to the low density and porosity of the film, the SiCN:H film deposited in comparative example 4 absorbs moisture. The film of comparative example 4 is not viable as an adhesion layer. Additionally, due to the low density, the film would be a poor copper barrier layer and is likely to outgas during a bonding process, which would adversely affect the substrate-substrate bond strength. The unacceptable film formed in comparative example 4 shows that depositing acceptable SiCN:H films at low temperatures (e.g. <250° C.) is not a trivial modification.

EXEMPLARY EMBODIMENTS

The present invention provides a method of depositing hydrogenated silicon carbon nitride (SiCN:H) films that are acceptable for use as adhesion layers in a surface activated bonding process. In particular, acceptable SiCN:H films can be deposited onto substrates at temperatures of less than about 250° C., optionally less than 200° C., and optionally about 175° C. The substrate can be a semiconductor substrate, such as a silicon substrate or silicon wafer. The substrate can comprise a plurality of die. The substrate can comprise temperature sensitive features, such as device layers and interconnects, which may include copper layers embedded in a dielectric.

Exemplary embodiments of the invention comprise introducing a silicon donating precursor, a carbon-donating precursor, and a nitrogen donating precursor into a PECVD chamber. Optionally, one or more non-reactive carrier gases may also be introduced into the chamber. A plasma is sustained within the chamber so that a PECVD process can occur, which causes SiCN:H to deposit onto the substrate. The silicon donating precursor is silane ($SiH_4$). The nitrogen donating precursor is nitrogen gas ($N_2$). The carbon-donating precursor can be an organosilane, methane ($CH_4$), acetylene ($C_2H_2$), or combinations thereof. The organosilane can be methylsilane, dimethylsilane, trimethylsilane (3MS), tetramethylsilane (4MS), or combinations thereof.

Table 1 shows exemplary PECVD process parameters suitable for achieving stable SiCN:H films at a deposition temperature in a range of 100–250° C.

TABLE 1

| Process Parameters | | Range | Preferred Range |
| --- | --- | --- | --- |
| Chamber pressure | mT | 1000-5000 | 1400-3000 |
| $N_2$ flow rate | Sccm | 1000-10,000 | 2500-8000 |
| Carbon-donating precursor (e.g. 3 MS) flow rate | Sccm | 10-90 | 10-55 |
| $SiH_4$ flow rate | Sccm | 100-500 | 200-300 |
| HF RF power | W | 250-1250 | 500-1000 |
| LF RF power | W | 0-400 | 0-200 |
| Temperature | ° C. | 100-250 | 100-200° C. |

Example 5

In one exemplary embodiment (Example 5), a SiCN:H film was deposited onto a 300 mm silicon wafer at 175° C. by PECVD. The reactive precursors were silane ($SiH_4$), trimethylsilane (3MS) as the carbon-donating precursor, and nitrogen gas ($N_2$).

Using the combination of a (non-carbon containing) silane, and a discrete carbon-containing precursor allows the carbon content of the SiCN:H films to be fine-tuned and varied in a controlled manner. This can also be more cost-effective than using a single organosilane precursor. The chamber pressure was in the range of 1-5 Torr. The plasma was sustained using a mixed frequency RF power. The mixed frequency RF power comprised a high frequency RF (operating at 13.56 Hz) and a low frequency RF (operating at 380 kHz).

Figure 4:
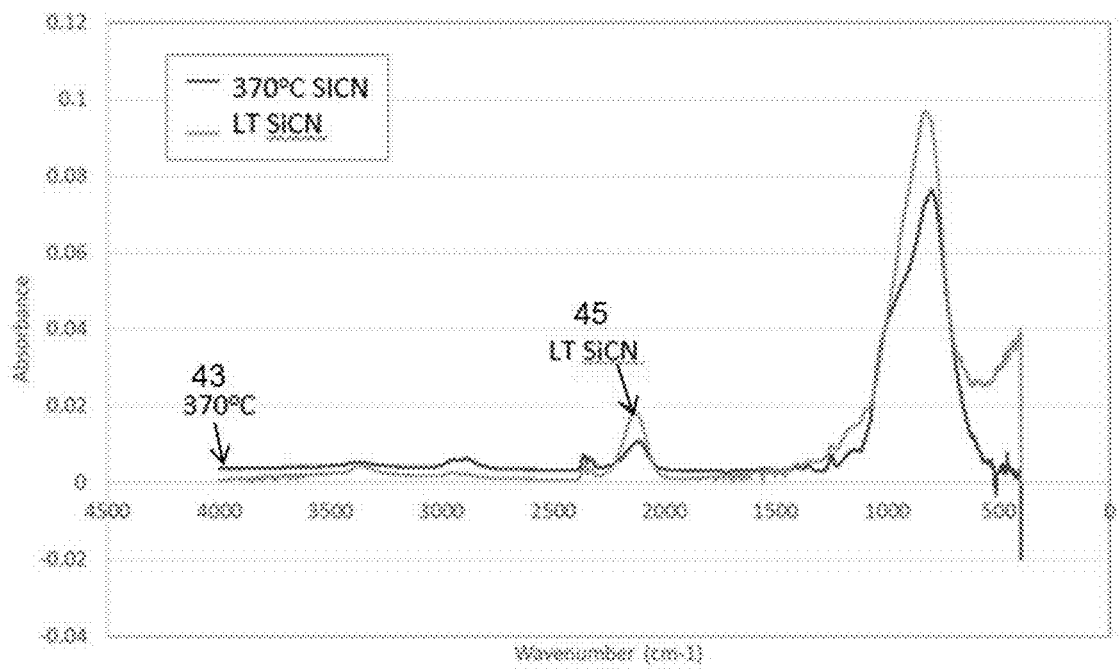
FIG. 4 shows FTIR spectra of a SiCN:H films deposited using a method of the present invention, and a comparative example.

FIG. 4 shows an FTIR spectrum of the as deposited SiCN:H film using the method of Example 5 (line 45). Line 43 (FIG. 4) corresponds to a SiCN:H film deposited at 370° C. using the same conditions as those used in comparative example 3. Comparative example 3 is used here as an exemplar spectrum of a SiCN:H film that is acceptable for use as an adhesion layer.

Table 2 shows the FTIR peak areas using the SiN peak to normalise the results.

TABLE 2

| FTIR Peak Ratios | SiC/SiN | SiH/SiN | SiCHx/SiN | NH/SiN | RI |
| --- | --- | --- | --- | --- | --- |
| HT $NH_3$ based SiCN:H (Comparative example 3) | 0.0042 | 0.0466 | 0.0042 | 0.0097 | 1.9762 |
| LT $NH_3$ Based SiCN:H (Comparative example 4) | 0.0956 | 0.0512 | 0.0281 | 0.0757 | 1.5691 |
| LT $N_2$ Based SiCN:H (Example 5) | 0.0036 | 0.1230 | 0.0080 | 0.0179 | 1.9972 |

The FTIR spectrum of the SiCN:H film deposited using the low temperature (LT) method of Example 5 (line 45) was similar to that of the deposited film in comparative example 3 (line 33, 43). However, the SiCN:H film of Example 5 exhibits a stronger Si—H peak (~2120 cm$^{-1}$) than the high temperature (HT) comparative example 3. This is a characteristic trait of SiCN:H films deposited using methods of the present invention.

Furthermore, based on Table 2, it is apparent the SiC/SiN, $SiCH_x$/SiN, and NH/SiN ratios of Example 5 are a closer match with comparative example 3 than the results of comparative example 4. Additionally, the refractive indexes of comparative example 3 and Example 5 are closely matched. The low refractive index for comparative example 4 suggests this film has a very low density, and is not acceptable for use as an adhesion layer. Example 5 achieves a far superior film compared to comparative example 4 (also deposited at low temperature but using a known deposition recipe). Using a mixture of reactive precursors comprising the combination of silane ($SiH_4$), a carbon-donating precursor, and nitrogen gas ($N_2$) provide suitable conditions for depositing SiCN:H films that have improved qualities, whilst maintaining a low thermal budget. The SiCN:H films deposited using the present methods are acceptable for use as an adhesion layer in surface activated bonding processes, and can provide acceptable copper barrier layer characteristics.

Whilst Example 5 uses a 3MS carbon-donating precursor, acceptable results would be expected to occur if the 3MS precursor was substituted with other carbon-donating precursors, such as alternative organosilane precursors, e.g. tetramethylsilane (4MS).

Figure 5:
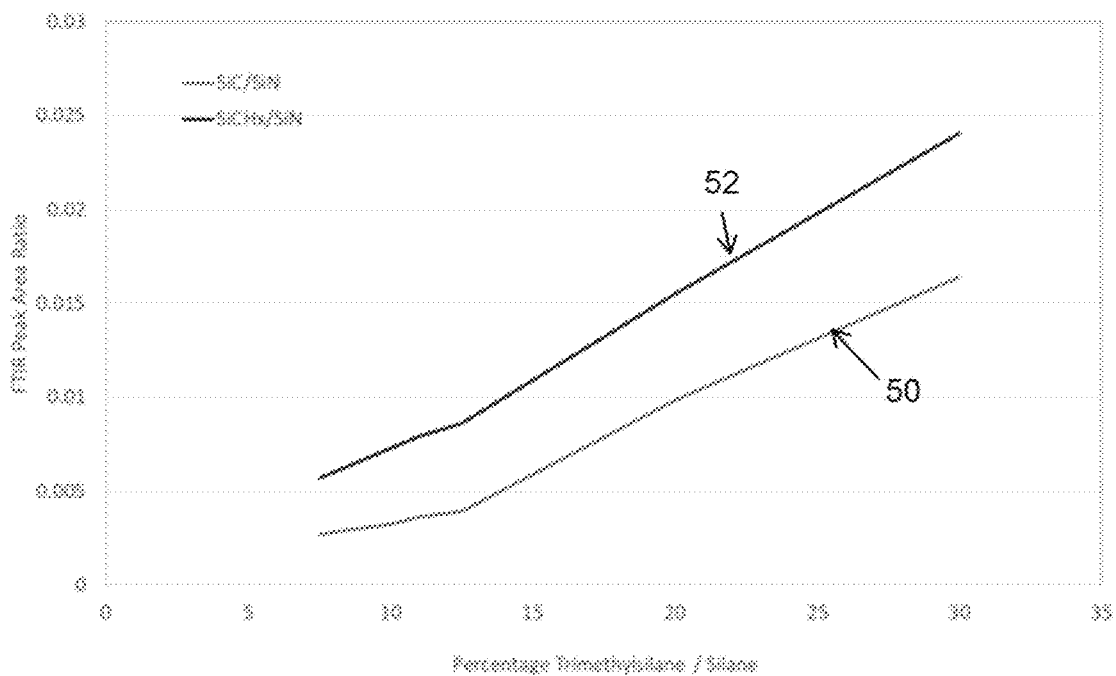
FIG. 5 is a plot showing carbon content in the as deposited SiCN:H layer as a function of the carbon-donating precursor to silane ratio.

The carbon-donating precursor to silane ratio can be varied by changing the flow rates of the reactive precursors. FIG. 5 shows how the ratio (as a percentage) of carbon-donating precursor (i.e. 3MS in this example) to silane ($SiH_4$) affects the SiC/SiN (~1250 $cm^{-1}$) and $SiCH_x$/SiN (~2900 $cm^{-1}$) FTIR peak area ratios (lines 50 and 52 respectively). The peak areas were ratioed to the major SiN peak area (at ~840 $cm^{-1}$) to normalise the results to variations in film thickness. Controlling the carbon-donating precursor to silane ($SiH_4$) ratio allows the carbon content of the film to be varied in a controllable manner.

Figure 6:
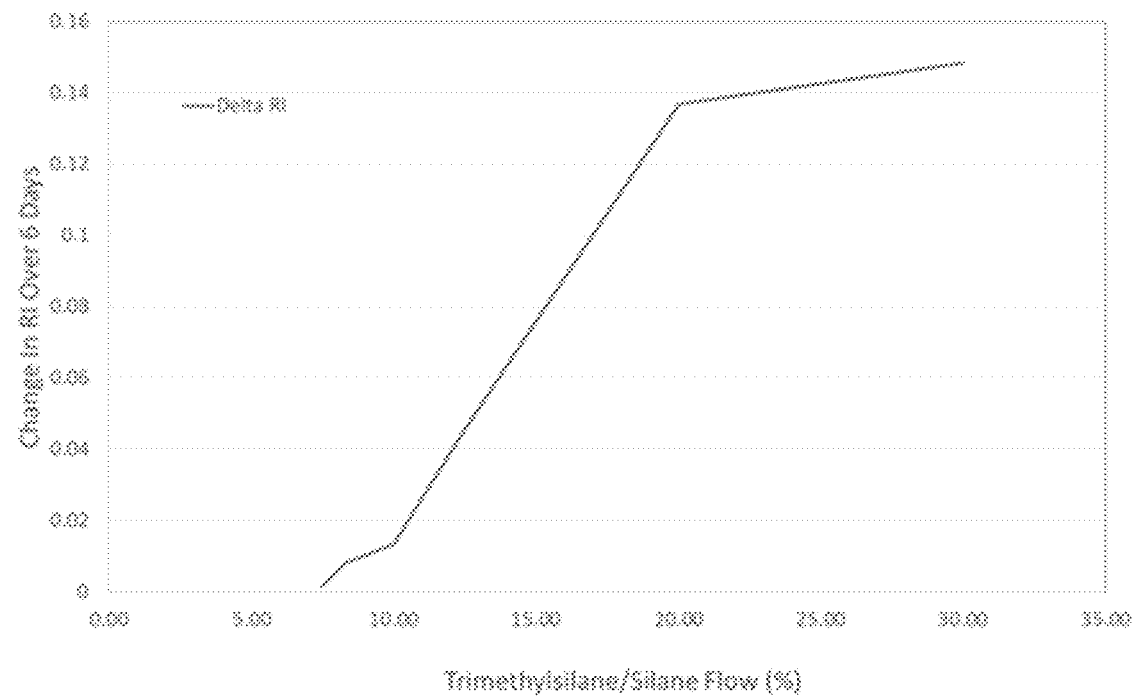
FIG. 6 is a plot showing the change in refractive index (RI) after a period of six days as a function of the carbon-donating precursor to silane ratio.

FIG. 6 shows how the ratio (as a percentage) of carbon-donating precursor (i.e. 3MS in this example) to silane ($SiH_4$) affects the stability of the measured refractive index over a six day period. A lower $3MS/SiH_4$ flow rate ratio gave less of a change (reduction) in RI over time, which is indicative of a more stable film that is less moisture sensitive. Films with a $3MS/SiH_4$ ratio of ~20% provided an acceptable change in RI of less than 0.14. However, a $3MS/SiH_4$ flow rate ratio of ~10% provided a significant improvement in stability of the measured RI. Varying the carbon-donating precursor to silane flow rate ratio allows the carbon content in the SiCN:H films to be fine-tuned. Without wishing to be bound by any theory or conjecture, it is believed that a high carbon content in the films can provide an improved bonding strength. However, SiCN:H films with higher carbon content are also more susceptible to moisture absorption, and therefore are less stable.

Figure 7:
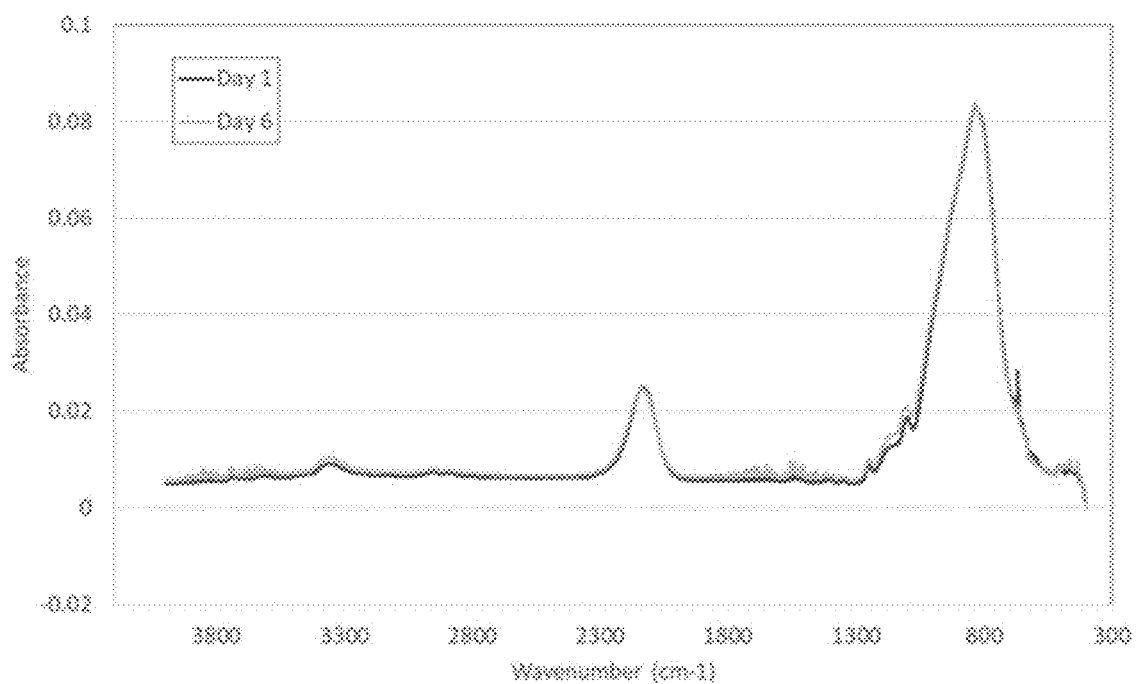
FIG. 7 shows FTIR spectra of a SiCN:H film before and after a period of exposure to air for six days.

FIG. 7 shows that the FTIR spectra of the SiCN:H films deposited using these methods show no significant change in their FTIR spectra over a six day period, indicating that the films are stable. In particular, there was no observable increase in an Si—O peak (~1050 $cm^{-1}$) and only a minimal increase in —OH peak (~3350 $cm^{-1}$) after six days of exposure to atmosphere. This indicates the film is stable and that only minimal water vapour absorption occurs after exposure to atmosphere at room temperature.

Figure 8:
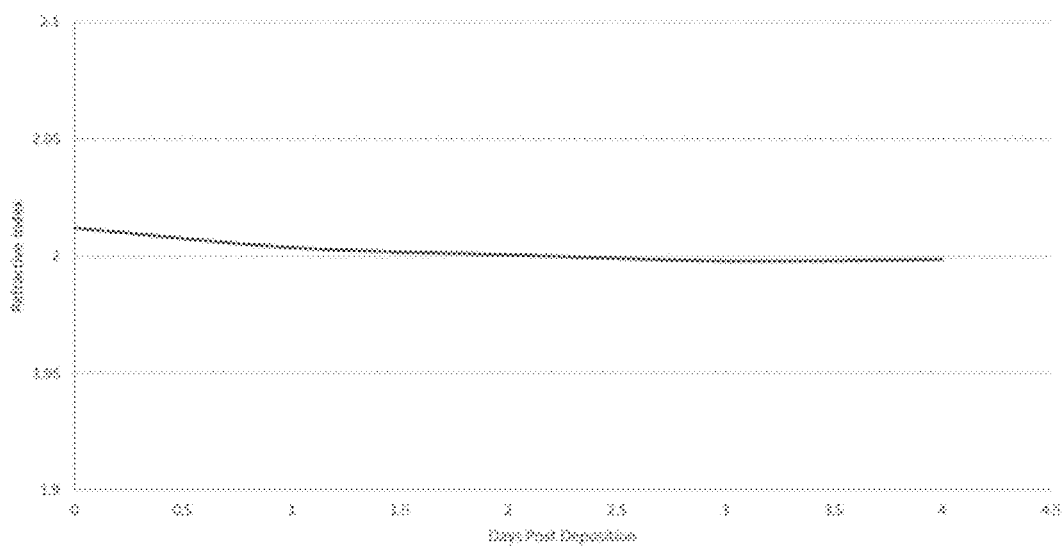
FIG. 8 is a plot showing the change in refractive index (RI) for a SiCN:H film deposited using an exemplary method of the invention.

FIG. 8 shows how the refractive index varies over a six day period when exposed to atmosphere. An initial reduction in RI is observed within the first 24 hour period. However, thereafter, the RI remains stable at about 2.00.

Post-Deposition Treatment

An optional post-deposition treatment can be performed on the SiCN:H films deposited using methods of the present invention. The post-deposition treatment can improve the stability of the film, and further improve (reduce) the film's sensitivity to moisture. The post-deposition treatment can be a thermal anneal, a plasma treatment (such as a hydrogen plasma treatment), an e-beam treatment, an ultraviolet curing technique, or a combination thereof. Preferably, the post-deposition treatment is a hydrogen plasma treatment.

A hydrogen plasma treatment can comprise exposing the as deposited SiCN:H film to a hydrogen plasma, preferably without a break in vacuum and/or without exposure to water vapour/moisture. The hydrogen plasma treatment can comprise introducing a hydrogen gas precursor into the chamber and sustaining a plasma. The pressure in the chamber can be about 2 Torr. A high frequency RF power (e.g. operating at 13.56 MHz) of about 1 kW can be used to sustain the plasma. The hydrogen plasma treatment can be performed for a duration of about 30-300 s, optionally about 60 s. During the hydrogen plasma treatment, the substrate can be maintained at a temperature that is lower than the temperature used for the SiCN:H deposition step. For example, during the hydrogen plasma treatment, the substrate can be maintained at a temperature of about 200° C. or less, optionally about 175° C. or less, optionally about 150° C. or less, or optionally about 125° C. Performing the hydrogen plasma treatment at a low temperature (e.g. lower than the SiCN:H deposition step) can keep the substrate within low thermal budget constraints. This can help avoid damaging any temperature sensitive features of the substrate.

Figure 9:
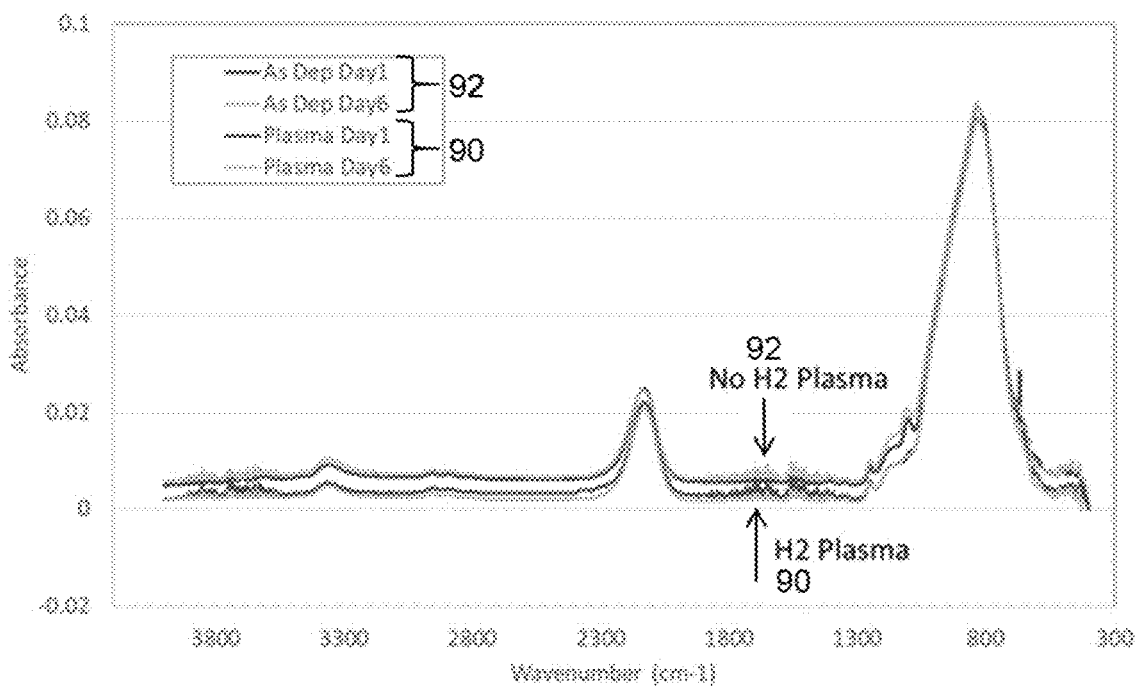
FIG. 9 shows FTIR spectra of SiCN:H deposited using exemplary methods of the invention.

FIG. 9 shows how the FTIR spectrum changes over a six day period with and without a post-deposition hydrogen plasma treatment (lines 90 and 92 respectively).

Figure 10:
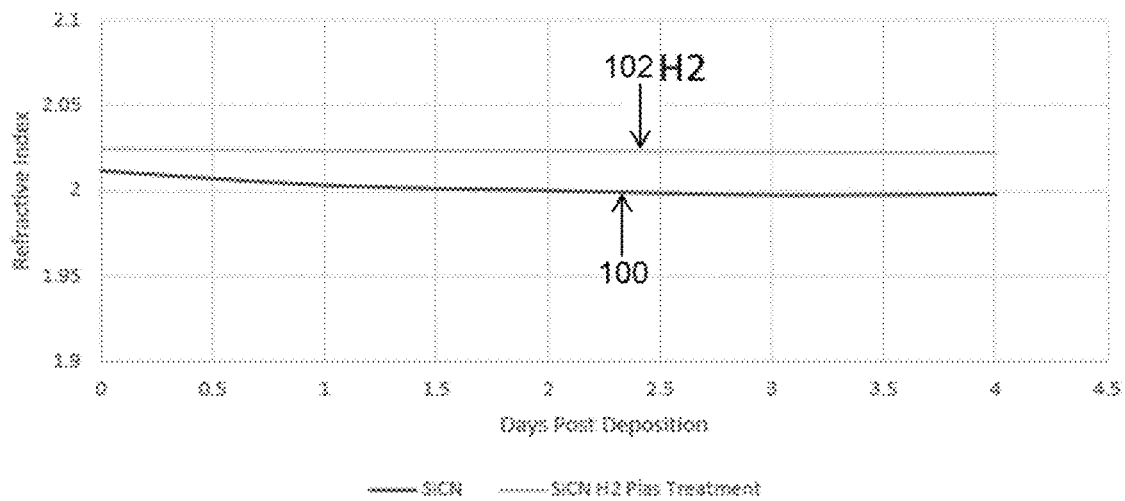
FIG. 10 is a plot showing the change in refractive index of SiCN:H films deposited using exemplary methods of the invention.

FIG. 10 shows how a post-deposition hydrogen plasma treatment affects the stability of the RI of the deposited SiCN:H films over a six day period. Without a post-deposition hydrogen plasma treatment (line 100), an initial reduction in RI is observed within the first 24 hour period. However, thereafter, the RI remains stable at about 2.00. However, using a post-deposition hydrogen plasma treatment further improves the stability of the RI (line 102). Negligible changes in RI were observed over a six day period, with the RI retaining a value of about 2.02-2.03. Without wishing to be bound by any theory or conjecture, it is believed that the hydrogen plasma treatment passivates the SiCN:H surface so that it prevents the absorption of moisture. A post-deposition hydrogen plasma treatment can be used to improve the stability of the SiCN:H films.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A method of depositing a hydrogenated silicon carbon nitride (SiCN:H) film onto a substrate by plasma enhanced chemical vapour deposition (PECVD) comprising:
    providing the substrate in a chamber of a parallel plate PECVD apparatus;
    introducing silane ($SiH_4$), a carbon-donating precursor, and nitrogen gas ($N_2$) into the chamber, wherein the silane ($SiH_4$) is introduced into the chamber at a flow rate greater than a flow rate of the carbon-donating precursor, and wherein the flow rate for the silane ($SiH_4$) and the flow rate for the carbon-donating precursor are independently controlled during the introducing; and
    sustaining a plasma in the chamber so as to deposit SiCN:H onto the substrate by PECVD, wherein the substrate is maintained at a temperature of less than about 250° C., and wherein the chamber has a pressure in the range of 1-5 Torr whilst the plasma is being sustained in the chamber.

2. The method according to claim 1, wherein the carbon-donating precursor is an organosilane.

3. The method according to claim 2, wherein the organosilane is methylsilane, dimethylsilane, trimethylsilane, tetramethylsilane, or a combination thereof.

4. The method according to claim 1, wherein the carbon donating precursor is a gaseous hydrocarbon.

5. The method according to claim 4, wherein the gaseous hydrocarbon is methane ($CH_4$), acetylene ($C_2H_2$), or a combination thereof.

6. The method according to claim 1, wherein the flow rate for the silane ($SiH_4$) is in the range of 100-500 sccm.

7. The method according to claim 1, wherein the flow rate for the carbon-donating precursor is in the range of 10-90 sccm.

8. The method according to claim 1, wherein the flow rates for the silane ($SiH_4$) and the carbon-donating precursor are in a ratio in the range of 3:1 to 30:1.

9. The method according to claim 8, wherein the ratio is about 10:1 to 12:1.

10. The method according to claim 1, wherein the nitrogen gas ($N_2$) is introduced into the chamber at a flow rate in the range of 1000-10,000 sccm.

11. The method according to claim 1, wherein the substrate is maintained at a temperature of less than 225° C.

12. The method according to claim 1, further comprising the subsequent step of performing a hydrogen plasma treatment comprising exposing the SiCN:H film to a hydrogen plasma.

13. The method according to claim 12, wherein during the hydrogen plasma treatment, the substrate is maintained at a temperature of less than about 200° C.

14. The method according to claim 1, wherein the hydrogenated silicon carbon nitride film is an amorphous hydrogenated silicon carbon nitride film (a-SiCN:H).

15. The method according to claim 1, wherein the substrate is a semiconductor substrate.

16. The method of claim 1, wherein the plasma is sustained using an RF power with a frequency in a range of 10 MHz to 15 MHz.

17. The method of claim 16, wherein the RF power has a power in a range of 250 W to 1250 W.

18. The method of claim 1, wherein the plasma is sustained using an RF power with a frequency in a range of 100 kHz to 500 kHz.

19. The method of claim 18, wherein the RF power has a power in a range of 0 W to 400 W.

* * * * *

UNITED STATES PATENT AND TRADEMARK OFFICE
CERTIFICATE OF CORRECTION

| | | |
|---|---|---|
| PATENT NO. | : 12,131,899 B2 | Page 1 of 1 |
| APPLICATION NO. | : 17/326273 | |
| DATED | : October 29, 2024 | |
| INVENTOR(S) | : Harper et al. | |

It is certified that error appears in the above-identified patent and that said Letters Patent is hereby corrected as shown below:

On the Title Page

The Assignee at item (73) should read:
-- SPTS Technologies Limited, Newport (GB) --

Signed and Sealed this
Thirteenth Day of May, 2025

Coke Morgan Stewart
*Acting Director of the United States Patent and Trademark Office*